(12) United States Patent
Lin

(10) Patent No.: US 9,667,254 B2
(45) Date of Patent: May 30, 2017

(54) ELECTRONIC DEVICE ASSEMBLY

(71) Applicant: HON HAI PRECISION INDUSTRY CO., LTD., New Taipei (TW)

(72) Inventor: Ching-Chung Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 295 days.

(21) Appl. No.: 14/510,705

(22) Filed: Oct. 9, 2014

(65) Prior Publication Data

US 2015/0109026 A1 Apr. 23, 2015

(30) Foreign Application Priority Data

Oct. 22, 2013 (CN) .......................... 2013 1 0498084

(51) Int. Cl.
 *H03K 19/018* (2006.01)
 *G06F 13/38* (2006.01)
(52) U.S. Cl.
 CPC ..... *H03K 19/01806* (2013.01); *G06F 13/385* (2013.01); *H03K 19/01825* (2013.01)
(58) Field of Classification Search
 None
 See application file for complete search history.

(56) References Cited

U.S. PATENT DOCUMENTS

| | | | | |
|---|---|---|---|---|
| 5,317,693 A | * | 5/1994 | Cuenod | G06F 9/4411 370/257 |
| 5,345,564 A | * | 9/1994 | Jensen | G06F 1/3203 713/600 |
| 5,761,697 A | * | 6/1998 | Curry | G01K 1/028 374/E1.006 |
| 6,509,659 B1 | * | 1/2003 | Carroll | H01R 27/00 307/125 |
| 8,698,543 B1 | * | 4/2014 | Dribinsky | G06F 13/4077 327/333 |
| 2001/0001868 A1 | * | 5/2001 | Klein | G06F 13/126 710/110 |
| 2004/0019720 A1 | * | 1/2004 | Trembley | G06F 13/4282 710/110 |
| 2004/0158750 A1 | * | 8/2004 | Syed | G06F 1/3203 713/320 |

(Continued)

FOREIGN PATENT DOCUMENTS

| | | |
|---|---|---|
| CN | 101022645 A | 8/2007 |
| DE | 19647668 A1 | 5/1998 |

(Continued)

*Primary Examiner* — Crystal L Hammond
(74) *Attorney, Agent, or Firm* — Steven Reiss

(57) ABSTRACT

An electronic device assembly includes a master device, and a plurality of peripheral devices. The master device includes a signal reading unit, a layer identification unit, and a selecting and controlling unit. The plurality of peripheral devices is coupled to the master device and connected one by one in series. The signal reading unit is configured to read layer signals from the plurality of peripheral devices, the layer identification unit is configured to identify a layer information of the plurality of peripheral devices according to the layer signals; and the selecting and controlling unit is configured to select and control one or more of the plurality of peripheral electronic devices according to the layer information.

20 Claims, 3 Drawing Sheets

(56) References Cited

U.S. PATENT DOCUMENTS

| | | | |
|---|---|---|---|
| 2006/0065743 A1* | 3/2006 | Fruhauf | G06F 13/385 235/492 |
| 2007/0067542 A1* | 3/2007 | Vergnes | G06F 13/4022 710/307 |
| 2007/0106825 A1* | 5/2007 | Duval | G06F 13/4081 710/106 |
| 2011/0122978 A1* | 5/2011 | Peichel | H04L 7/0008 375/354 |
| 2012/0072626 A1 | 3/2012 | Scott et al. | |
| 2013/0057339 A1 | 3/2013 | Koudar | |
| 2015/0270994 A1* | 9/2015 | Scherr | H04L 25/4902 375/238 |
| 2015/0318683 A1* | 11/2015 | Voelger | H02H 3/20 361/91.1 |

FOREIGN PATENT DOCUMENTS

| | | |
|---|---|---|
| DE | 10147512 A1 | 4/2003 |
| DE | 10261174 B3 | 6/2004 |
| TW | 200943650 A | 10/2009 |
| WO | 2012105409 A1 | 8/2012 |

* cited by examiner

ELECTRONIC DEVICE ASSEMBLY

CROSS-REFERENCE TO RELATED APPLICATIONS

This application claims priority to Chinese Patent Application No. 201310498084.1 filed on Oct. 22, 2013, the contents of which are incorporated by reference herein.

FIELD

The subject matter herein generally relates to electronic device assemblies.

BACKGROUND

Electronic master devices, such as monitor, computer, and so on, are coupled to a plurality of peripheral devices, such as mobile phones, universal serial buses (USBs), and so on. The plurality of peripheral devices is connected to the main electronic devices in parallel.

BRIEF DESCRIPTION OF THE DRAWINGS

Implementations of the present technology will now be described, by way of example only, with reference to the attached figures.

DETAILED DESCRIPTION

Figure 1:
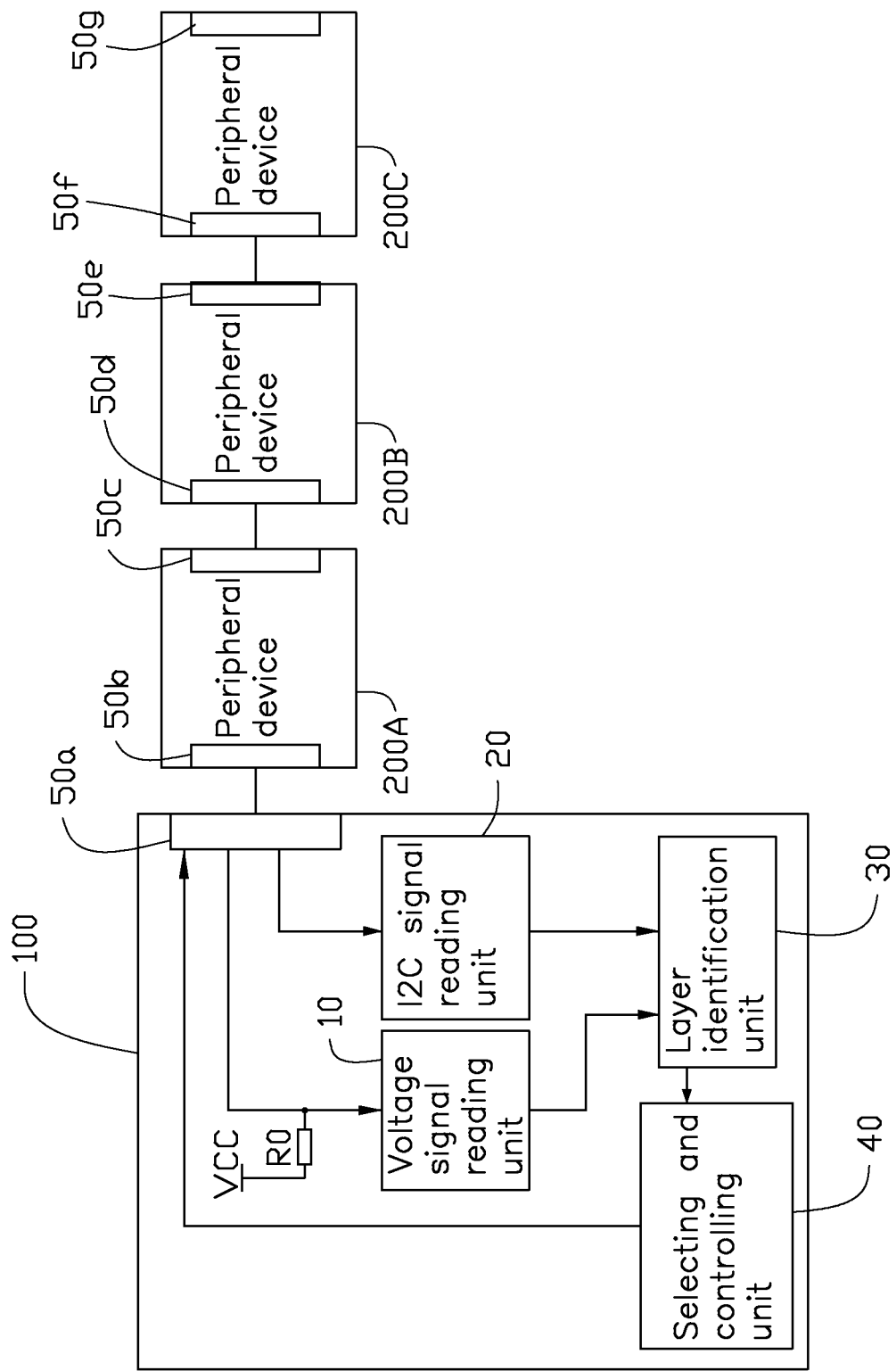
FIG. 1 is a block diagram of one embodiment of an electronic device assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates an electronic device assembly in accordance with an embodiment. The electronic device assembly can include a master device 100 and a plurality of peripheral devices 200A-200C. The peripheral devices 200A-200C can be coupled to the master device 100 via a first connector 50a and can be connected one by one in series. In at least one embodiment, the master device 100 can be a monitor or computer, and the plurality of peripheral devices 200A-200C can be tablet computers, mobile phones, set top boxes, power supplies, hard disks, routers and so on.

In this embodiment, the plurality of peripheral devices 200A-200C can include a first peripheral device 200A, a second peripheral device 200B, and a third peripheral device 200C. A second connector 50b of the first peripheral device 200A can be coupled to the first connector 50a, and a second connector 50c of the first peripheral device 200A can be coupled to a second connector 50d of the second peripheral device 200B. A second connector 50e of the second peripheral device 200B can be coupled to a second connector 50f of the third peripheral device 200C, and a second connector 50g of the third peripheral device 200C can be coupled to another peripheral device.

Each first connector 50a and second connectors 50b-50g can have different types of interfaces or with same type of interfaces. In at least one embodiment, the interfaces may be high-definition multimedia interfaces (HDMIs), universal serial buses (USBs), or external serial advanced technology attachments (ESATAs).

The master device 100 can include a voltage signal reading unit 10, an inter-integrated circuit (I2C) signal reading unit, a layer identification unit 30, and a selecting and controlling unit 40. The voltage signal reading unit 10 can be electrically coupled to the first connector 50a and can read potential signals of the plurality of peripheral devices 200A-200C coupled to the master device 100. The layer identification unit 30 can be electrically coupled to the voltage signal reading unit 10 and can identify layer information of the plurality of peripheral devices 200A-200C according to the potential signals. The layer information can include a total layer and a layer number of the plurality of peripheral devices 200A-200C. The I2C signal reading unit 20 can be coupled to the first connector 50a and the layer identification unit 30, and the I2C signal reading unit 20 can further read I2C signals transmitted by the plurality of peripheral devices 200A-200C. The layer identification unit 30 can identify the layer information of the plurality of peripheral devices 200A-200C. The selecting and controlling unit 40 can be coupled to the first connector 50a and the layer identification unit 30. The selecting and controlling unit 40 can send control signals to the first connector 50a to select one or more of the plurality of peripheral devices 200A-200C according to the identified layer information. In this embodiment, the first peripheral device 200A is a first layer, the second peripheral device 200B is a second layer, and the third peripheral device 200C is a third layer. The layer identification unit 30 identifies three layers. The selecting and controlling unit 40 can selectively communicate and control the first layer or/and the second layer or/and the third layer. For example, the master device 100 can control a power switch module to be switched off/on, a brightness, a contrast, a sound and so on of the plurality of peripheral devices 200A-200C.

Figure 2:
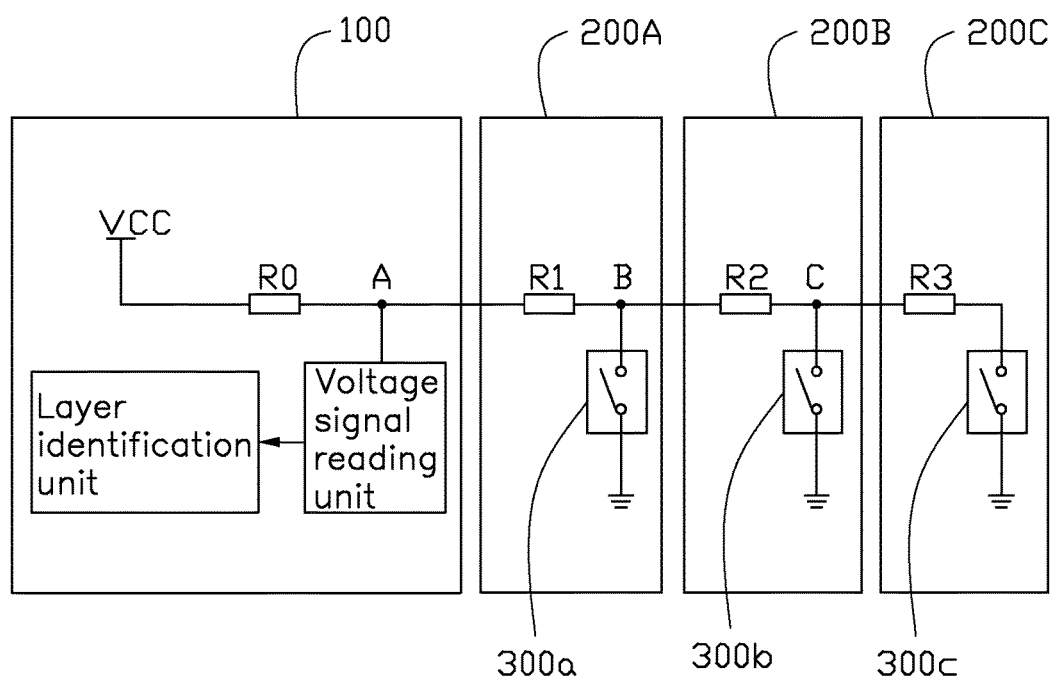
FIG. 2 is another block diagram of the electronic device assembly of FIG. 1.

FIG. 2 illustrates that the master device 100 can include a pull-up resistor R0. A first terminal of the pull-up resistor R0 can be electrically coupled to a power supply VCC, and a second terminal of the pull-up resistor R0 can be coupled to the first peripheral device 200A. The first peripheral device 200A can include a first divider resistor R1 and a first switch module 300a. A first terminal of the first divider resistor R1 is electrically coupled to the pull-up resistor R0, and a second terminal of the first divider resistor R1 is electrically coupled to the first switch module 300a. The second peripheral device 200B can include a second divider resistor R2 and a second switch module 300b. A first terminal of the second divider resistor R2 can be electrically coupled to the second terminal of the first divider resistor R1, and a second terminal of the second divider resistor R2 can be electrically coupled to the second switch module 300b. The third peripheral device 300C can include a third divider resistor R3 and a third switch module 300c. A first terminal of the third divider resistor R3 can be electrically coupled to the second terminal of the second divider resistor R2, and a second terminal of the third divider resistor R3 can be electrically coupled to the third switch module 300c. In at least one embodiment, the value of the pull-up resistor R0 is equal to each value of the first divider resistor R1, the second divider resistor R2, and the third divider resistor R3.

Figure 3:
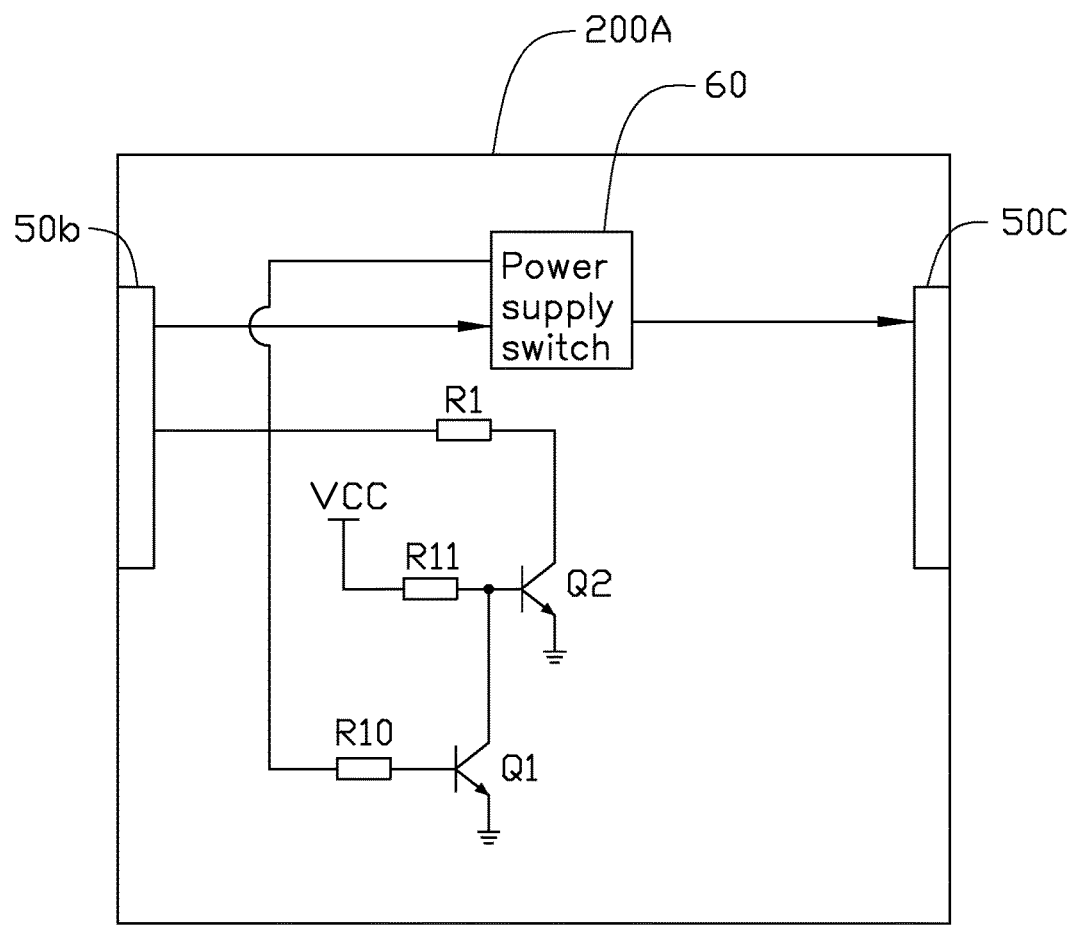
FIG. 3 is a block diagram of a peripheral device of FIG. 1.

FIG. 3 illustrates that each first switch module 300a, second switch module 300b, and third switch module 300c can include a first transistor Q1, and a second transistor Q2. A base terminal of the first transistor Q1 can be electrically coupled to a power supply switch 60 via a first resistor R10. A collector terminal of the first transistor Q1 can be electrically coupled to a base terminal of the second transistor Q2. An emitter terminal of the first transistor Q1 is grounded. A base terminal of the second transistor Q2 can be electrically coupled to the power supply VCC via a second resistor R11. A collector terminal of the second transistor Q2 can be electrically coupled to the second terminal of the first divider resistor R1. An emitter terminal of the second transistor Q2 is grounded. In at least one embodiment, the first transistor Q1 and the second transistor Q2 are both NPN-type transistor.

When the first peripheral device 200A is coupled to the master device 100, the first switch module 300a is switched on. The potential of the node A is equal to a half of the power supply VCC. The voltage reading unit 10 can obtain the potential of the node A, and the layer identification unit 30 can identify there is one layer outside of the master device 100.

When the first peripheral device 200A and the second peripheral device 200B are coupled one by one in series, and the first peripheral device 200A is coupled to the master device 100, the first switch module 300a is switch off, and the second switch 300b is switch on. The potential of the node A is equal to two thirds of the power supply VCC, and the potential of the node B is equal to one third of the power supply VCC. The voltage reading unit 10 can obtain the potentials of the nodes A, B, and the layer identification unit 30 can identify there is two layers outside of the master device 100. The layer identification unit 30 can further identify the first peripheral device 200A being located in the first layer and the second peripheral device 200B being located in the second layer.

When the first peripheral device 200A, the second peripheral device 200B, and the third peripheral device 200C are coupled to one by one in series, and the first peripheral device 200A is coupled to the master device 100, the first switch module 300a and the second switch module 300b are switch off, and the second switch 300c is switch on. The potential of the node A is equal to three fourths of the power supply VCC, the potential of the node B is equal to a half of the power supply VCC, and the potential of the node C is equal to one third of the power supply VCC. The voltage reading unit 10 can obtain the potentials of the nodes A, B, C, and the layer identification unit 30 can identify there is three layers outside of the master device 100. The layer identification unit 30 can further identify the first peripheral device 200A being located in the first layer, the second peripheral device 200B being located in the second layer, and the third peripheral device 200C being located in the third layer. The layer identification unit 30 can identify there is three layers outside of the master device 100.

The embodiments shown and described above are only examples. Many details are often found in the art such as the other features of an electronic device assembly. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An electronic device assembly comprising:
   a master device comprising a signal reading unit, a layer identification unit, a selecting and controlling unit, and a pull-up resistor; and
   a plurality of peripheral devices connected in series and coupled to the master device, each peripheral device comprising a divider resistor being coupled to the pull-up resistor;
   wherein the plurality of divider resistors are coupled in series;
   the signal reading unit is configured to read layer signals from the plurality of peripheral devices according to the plurality of divider resistors;
   the layer identification unit is configured to identify a layer information of the plurality of peripheral devices according to the layer signals; and
   the selecting and controlling unit is configured to select and control one or more of the plurality of peripheral electronic devices according to the layer information.

2. The electronic device assembly of claim 1, wherein the plurality of peripheral devices comprises a first peripheral device, a second peripheral device, and a third peripheral device, the first peripheral device comprises a first divider resistor, the second peripheral device comprises a second divider resistor, and the third peripheral device comprises a third divider resistor; the first divider resistor, the second divider resistor, the third divider resistor are electrically coupled in series, and the first divider resistor is electrically coupled to the pull-up resistor.

3. The electronic device assembly of claim 2, wherein the signal reading unit is configured to read a potential signal of each first divider resistor, second divider resistor, and third divider resistor, the layer identification unit is configured to identify a total layer of the plurality of peripheral devices and a layer number of each peripheral device according to the potential signals.

4. The electronic device assembly of claim 3, wherein the value of the pull-up resistor is equal to the value of each first divider resistor, second divider resistor, and third divider resistor.

5. The electronic device assembly of claim 4, wherein a first switch module is electrically coupled to the first divider resistor and the second divider resistor, a second switch module is electrically coupled to the second divider resistor and third divider resistor, and a third switch module is electrically coupled to the third divider resistor; the first switch module and the second switch module are switched off, and the third switch module is switched on.

6. The electronic device assembly of claim 5, wherein each first peripheral device, second peripheral device, and third peripheral device comprises a power supply switch, the power supply switch of the third peripheral device is configured to provide a low-level signal to the third switch module, the power supply switches of the first peripheral device and the second peripheral device are configured to provide a high-level signal to the first switch module and the second switch module.

7. The electronic device assembly of claim 6, wherein each first switch module, second switch module, and third switch module comprises a first transistor and a second transistor, a base terminal of the first transistor is electrically coupled to the power supply switch, a collector terminal of the first transistor is electrically coupled to a base terminal of the second transistor, an emitter terminal of the second transistor is grounded; the base terminal of the second transistor is electrically coupled to a power source via a fourth resistor, a collector terminal of the second transistor is electrically coupled to the first divider resistor, and an emitter terminal of the second transistor is grounded.

8. The electronic device assembly of claim 1, wherein each peripheral device comprising a switch module coupled between the divider resistor and ground, the switch module of the last peripheral device is switched on, and each switch module of other peripheral devices is switched off, coupling the pull-up resistor and each divider resistor in series.

9. The electronic device assembly of claim 1, wherein the master device is electrically coupled to the plurality of peripheral devices via an inter-integrated circuit, the signal reading unit is configured to identify a total layer of the plurality of peripheral devices and a layer number of each peripheral device.

10. The electronic device assembly of claim 9, wherein the master device comprises a first connector, each peripheral device comprises two second connectors, the plurality of devices is coupled to the master device via the first connector, and each peripheral device is coupled to another peripheral device via at least one of the second connector, thereby connecting the plurality of peripheral devices one by one in series.

11. An electronic device assembly comprising:
a master device comprising a first connector, a signal reading unit, a layer identification unit, a selecting and controlling unit, and a pull-up resistor, wherein the signal reading unit is electrically coupled to the layer identification unit and the first connector, the selecting and controlling unit is electrically coupled to the first connector and the layer identification unit; and
a plurality of peripheral devices coupled to the first connector and coupled in series, each peripheral device comprising a divider resistor being coupled to the pull-up resistor;
wherein the plurality of divider resistors are coupled in series; the signal reading unit is configured to read layer signals from the plurality of peripheral devices according to the plurality of divider resistors, the layer identification unit is configured to identify a layer information of the plurality of peripheral devices according to the layer signals; and the selecting and controlling unit is configured to select and control one or more of the plurality of peripheral electronic devices according to the layer information.

12. The electronic device assembly of claim 11, wherein the plurality of peripheral devices comprises a first peripheral device, a second peripheral device, and a third peripheral device, the first peripheral device comprises a first divider resistor, the second peripheral device comprises a second divider resistor, and the third peripheral device comprises a third divider resistor; a first terminal of the pull-up resistor is coupled to a power supply, and a second terminal of the pull-up resistor is be electrically coupled to a first terminal of the first divider resistor, a second terminal of the first divider resistor is electrically coupled to a first terminal of the second divider resistor, a second terminal of the second divider resistor is electrically coupled to a first terminal of the third resistor.

13. The electronic device assembly of claim 12, wherein the signal reading unit is configured to read a potential signal of the first terminal of each first divider resistor, second divider resistor, and third divider resistor, the layer identification unit is configured to identify a total layer of the plurality of peripheral devices and a layer number of each peripheral device according to the potential signals.

14. The electronic device assembly of claim 13, wherein the value of the pull-up resistor is equal to the value of each first divider resistor, second divider resistor, and third divider resistor.

15. The electronic device assembly of claim 14, wherein a first switch module is electrically coupled to the first divider resistor and the second divider resistor, a second switch module is electrically coupled to the second divider resistor and third divider resistor, and a third switch module is electrically coupled to the third divider resistor; the first switch module and the second switch module are switched off, and the third switch module is switched on.

16. The electronic device assembly of claim 15, wherein each first peripheral device, second peripheral device, and third peripheral device comprises a power supply switch, the power supply switch of the third peripheral device is configured to provide a low-level signal to the third switch module, the power supply switches of the first peripheral device and the second peripheral device are configured to provide a high-level signal to the first switch module and the second switch module.

17. The electronic device assembly of claim 16, wherein each first switch module, second switch module, and third switch module comprises a first transistor and a second transistor, a base terminal of the first transistor is electrically coupled to the power supply switch, a collector terminal of the first transistor is electrically coupled to a base terminal of the second transistor, an emitter terminal of the second transistor is grounded; the base terminal of the second transistor is electrically coupled to a power source via a fourth resistor, a collector terminal of the second transistor is electrically coupled to the first divider resistor, and an emitter terminal of the second transistor is grounded.

18. The electronic device assembly of claim 11, wherein each peripheral device comprising a switch module coupled between the divider resistor and ground, the switch module of the last peripheral device is switched on, and each switch module of other peripheral devices is switched off, coupling the pull-up resistor and each divider resistor in series.

19. The electronic device assembly of claim 11, wherein the master device is electrically coupled to the plurality of peripheral devices via an inter-integrated circuit bus, the signal reading unit is configured to identify a total layer of the plurality of peripheral devices and a layer number of each peripheral device according to I2C signals transmitted by the plurality of peripheral devices.

20. The electronic device assembly of claim 19, wherein each peripheral device comprises two second connectors, the plurality of devices is coupled to the master device via the first connector, and each peripheral device is coupled to another peripheral device via at least one of the second connector, thereby connecting the plurality of peripheral devices one by one in series.

\* \* \* \* \*